United States Patent [19]

Bohler

[11] 3,711,774

[45] Jan. 16, 1973

[54] AUTOMATIC GAIN CALIBRATION

[75] Inventor: Walter Bohler, Norwalk, Conn.

[73] Assignee: The Perkin-Elmer Corporation, Norwalk, Conn.

[22] Filed: March 1, 1971

[21] Appl. No.: 119,585

[52] U.S. Cl. ......................324/115, 324/74, 324/130

[51] Int. Cl. ...........................G01r 15/08, G01r 1/38

[58] Field of Search ........324/130, 115, 99 R, 99 D, 77A, 324/74; 356/87

[56] References Cited

UNITED STATES PATENTS

| | | | |
|---|---|---|---|
| 3,579,105 | 5/1971 | Scott | 324/99 D |
| 2,516,189 | 7/1950 | Dinsmore | 324/77 A |
| 3,500,196 | 3/1970 | Cooper | 324/130 |
| 3,555,418 | 1/1971 | Fluegel | 324/130 X |
| 3,577,075 | 5/1971 | Krygeris | 324/99 D |

*Primary Examiner*—Rudolph V. Rolinec
*Assistant Examiner*—Ernest F. Karlsen
*Attorney*—Edward R. Hyde, Jr.

[57] ABSTRACT

Apparatus for causing unknown electrical signals to be measurable directly on a desired "scale" performs the functions of: determining the "scaling" gain factor to make a (known) standard electrical signal equal a (manually set) particular voltage level; storing this gain factor; subsequently regenerating the stored gain factor; and applying this regenerated gain factor to an unknown electrical signal. The disclosed embodiment determines the desired gain factor by integrating the standard signal until it equals the manually set voltage level, stores this integration time factor by a second integrator integrating the same standard input signal for the same time and preserving the integrated output value at the end of this timing, regenerates this integration time by the second integrator integrating again the same input until it reaches the value of the previously preserved output, and causes the first integrator to integrate the unknown signal during this same regenerated integration time (as determined by the second integrator).

8 Claims, 1 Drawing Figure

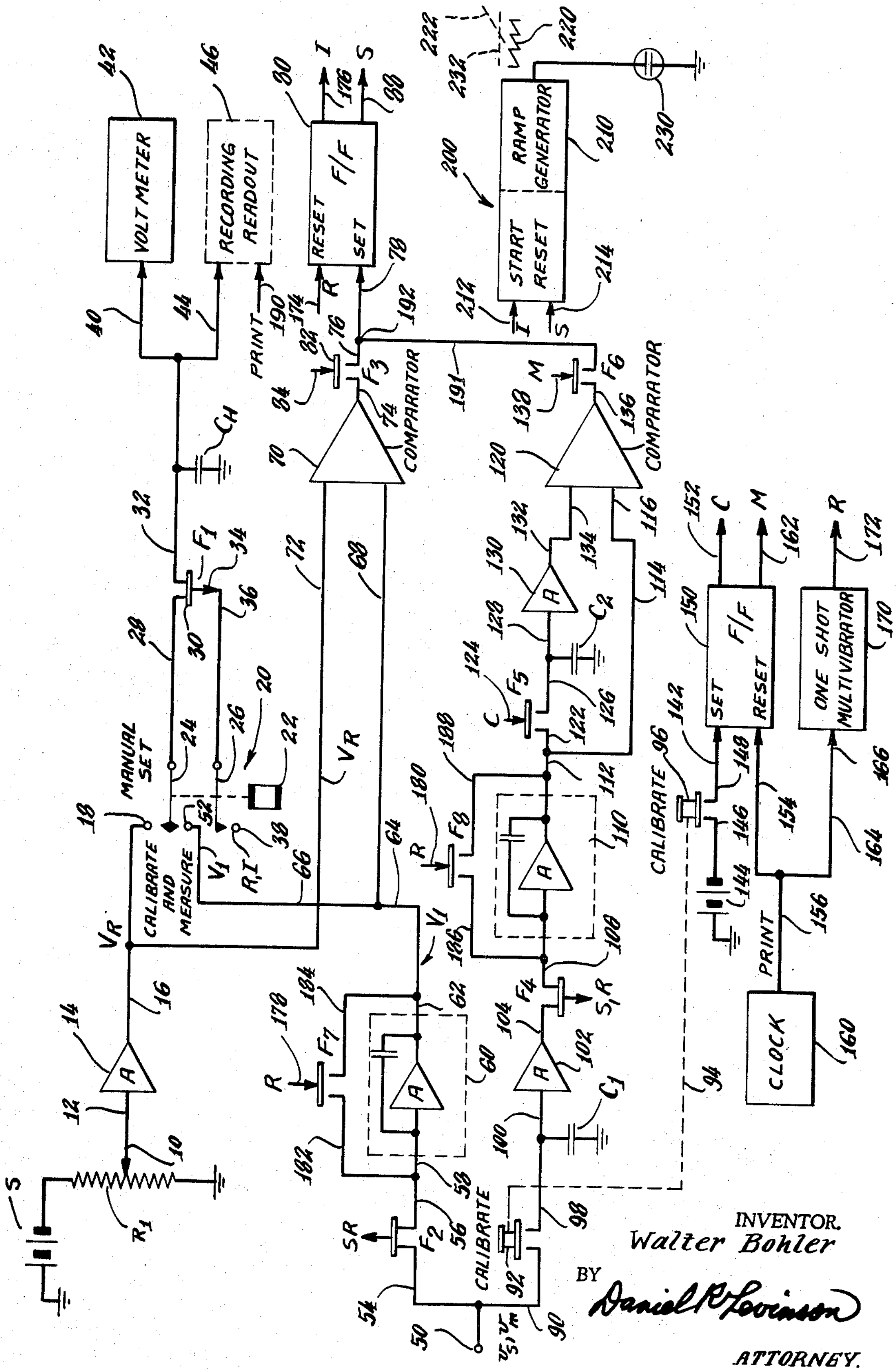
INVENTOR.
Walter Bohler
BY Daniel R. Levinson
ATTORNEY.

AUTOMATIC GAIN CALIBRATION

This invention relates to a device for providing a settable gain control so as to multiply an electrical input signal by a desired factor to cause the input signal to be read out on a desired expanded (or attenuated) scale. More particularly, the device determines from a standard input signal the gain factor necessary to make the output equal a desired signal level (hereinafter referred to as the "determination" or "calibration" step or mode of operation), stores this gain factor, and subsequently applies this same gain factor to unknown input signals to cause the resulting output to read directly in the desired "scale".

For purposes of description, the invention will be described as utilized to provide the desired gain factor setting to convert the output of an atomic absorption spectrophotometer to read directly in concentration of the sample element of interest. For example, in an atomic absorption instrument, the desired absorbance may be obtained from the output of a simple logarithmic converter. In order to convert this absorbance signal directly into units of concentration it is only necessary to multiply the absorbance signal by a particular constant factor.

It has already been proposed to provide a manually variable gain control. The primary practical difficulty of such previous manual gain control calibrating systems is that the operator is required to manually set the gain during the calibration step while a noisy signal is being supplied by the standard. Since it is desirable to have available a relatively large range of gain available (e.g., 200 to 1), the operator must attempt to set a highly sensitive manual gain to cause the volt meter to hover about the correct value as the input signal being multiplied exhibits rapid fluctuations. As a practical matter therefore the operator must compromise by setting the manually controllable gain to that value which in his opinion causes the volt meter to fluctuate about the "correct" value (e.g., 2.000 volts for a 200 parts per million standard sample).

The present invention avoids the above difficulty by requiring the operator to manually operate only a potentiometer receiving a fixed reference voltage so as to set the desired concentration level on the volt meter, and subsequently the device of the invention automatically determines the gain factor required to cause the input absorbance signal from a known (corresponding) concentration sample to reach this level. The device thus provides an automatic calibration by determining the gain factor necessary to make the input signal equal the manually set voltage level, remembers this gain setting, and subsequently applies it to unknown input (absorbance) signals (from unknown samples).

The exemplary disclosed device according to the invention accomplishes this automatic calibration and subsequent utilization during measuring modes by integrating the known (calibration) standard input signal until it reaches the set voltage level (e.g., 2.000 volts), while at the same time causing a second synchronized integrator to integrate a signal; by utilizing the same input signal as the input of the second integrator, a wide usable gain range with constant small percentage error is obtained as will appear subsequently.

An object of the invention is the provision of a device to determine and apply the gain factor necessary to proportion an input signal to a particular desired scale, which device requires relatively little manipulation or skill by the operator.

A further object of the invention is the provision of a device of the type just described which includes means for determining the gain factor necessary to cause a standard electrical signal to be made equal to a desired (manually settable) voltage, means for storing this gain factor, and means for multiplying subsequent unknown electrical input signals by this same gain factor, thereby causing the unknown input signals to be expanded (or attenuated) according to a particular desired scale.

Another object of the invention is the provision of a device according to the just-previous paragraph, in which the gain factor is determined, stored, and subsequently applied in such manner that the gain factor tends to have a constant (relatively low) percentage error over a large range of possible values.

A more specific object of the invention is the provision of a device according to the objects mentioned above in which the gain factor is determined by integrating the standard input signal for the exact time necessary to cause it to become equal to the manually settable voltage, and subsequently integrating unknown input signals for the same exact time, thereby causing the unknown input signals to be effectively multiplied by the same gain as was the standard signal.

A related specific object is the provision of a device according to the just-previous paragraph in which the same integrator is utilized for both determining the required time of integration from the standard signal and for later integrating the unknown input signals, thereby obtaining precise reproducible results in this function without requiring any matching of electrical components.

Another related specific object is the provision of a device according to the just-previous paragraph in which a second integrator, also integrating the standard signal during the determination step, is stopped when the first integrator determines that the integrated standard signal is equal to the settable voltage, and the second integrator is utilized to store and later provide the gain factor by causing it successively to repeat the exact same integration so as to act as a repetitive clock, whereby precision in both storing and applying the gain factor is assured by utilizing the same electrical components over and over again.

Other objects, features, and advantages of the invention will be obvious to one skilled in the art on reading the following detailed description in conjunction with the accompanying drawings in which:

The sole FIGURE is a schematic diagram, mostly in block form, of a preferred embodiment of a device according to the invention.

In the drawing a manually settable tap 10 of a potentiometer, formed by a voltage source S applied to one end of a grounded resistor $R_1$, is utilized to adjust a voltage supplied in the input 12 to buffer amplifier 14. The output of the amplifier at 16 is supplied to an upper contact 18 of manually operable ganged switch 20, which may be actuated, for example, by a button 22. This switch is shown in its in-between position, but in fact normally has the left-hand end of its upper and lower switch arms 24, 26, respectively, either in an upper or a lower position. When in its upper or "SET"

position (as by pressing of button 22), upper arm 24 will connect contact 18 to lead 28, which is connected to one side of switching element F1.

Element F1 and subsequently described elements designated by the letter "F" followed by a number may be field effect transistors (FET) or other electrical elements (e.g., solenoid actuated switches or relays) which are capable of being switched by an electrical signal. Since the drawing is essentially a block diagram, these F elements are shown in a manner depicting their function rather than their structure. Thus, element F1 is shown as comprising a bridging element 30 which "-normally" provides an electrical connection between leads 28 and 32; the arrow 34 points in the direction the bridging or switching element 30 is moved (in this case, out of contact with these leads and therefore breaking the circuit therebetween) when a signal is applied to the control lead 36. Hereinafter, similar schematic representations are utilized for the other analogous elements, so that the position of the bridging member indicates whether the switch is normally conducting (as is true of F1) or non-conducting, and the direction of the arrow indicates the position that this bridging element will be moved into by a signal applied to the control input.

Element F1 will be conducting at all times when the manual switch 20 is in its upper position, so that the voltage picked off by contact 10 will be supplied to lead 32, and therefore both to a holding capacitor $C_H$ and (by lead 40) to a digital volt meter 42. The amplified voltage may also be supplied by lead 44 to a recording readout 46. The uppermost or "SET" position of switch 20 therefore allows the operator to manually adjust the variable potentiometer so as to pick off at tap 10 a voltage causing the digital volt meter to receive a desired voltage, e.g., 2.00 or 0.200 volts when the standard signal to be applied represents a quantity (e.g., concentration) which may be written as 2.00 times $10^x$, where $x$ is any positive or negative integer. This relationship is hereinafter being called a "decimal relationship" for convenience. After the meter 42 has been set to the desired voltage having this decimal relationship to the standard signal to be used for calibrating the gain, the manually operable button 22 will be positioned so as to cause both switch arms 24 and 26 to be in their lower position, so that these arms are connected to contacts 52 and 38 respectively. The manually operable switch 20 will be in its lowermost or "CALIBRATE and MEASURE" position at all times after the operator has set the desired decimal scaling voltage at 40, 42 (and therefore on holding capacitor $C_H$) through elements 10, 12, 14, 16, 18 and 24, 28, F1, and 32.

The input terminal 50 to the device will receive during the "calibration" mode of operation a standard signal, say $v_s$, (e.g., one representing the output of a spectrophotometer in units at least proportional to absorbance of a known sample) which is a decimal multiple of the meter voltage (e.g., 2.00 or 0.200) chosen (e.g., from a standard "sample" known to contain 200 parts per million of the element to be measured). The standard signal ($v_s$) is fed by lead 54 to element F2 and, since this element is normally conducting, to lead 56 and therefore input 58 of a first integrator 60. Integrator 60 may be of the well-known type, comprising, for example, an amplifier including a substantially pure capacitive feedback loop, as indicated. The output 62 of the integrator will have a voltage, $V_1$, which will be the time integral of the input signal at 58. This output will be supplied at all times by leads 64 and 66 to contact 52 (now engaged by upper arm 24), and to the lower input head 68 to a first comparator 70.

The upper input to comparator 70 will be supplied by lead 72 with the previously manually set voltage from lead 16. The first comparator 70 is only used during the calibration mode, as will be described hereinafter, and therefore will be called the calibration comparator. Output 74 of this calibration comparator will of course indicate when the integrated value $V_1$ of the standard signal at 68 crosses (i.e., equals) in value the voltage $V_R$ fed at 72 to the upper input of the comparator. Output lead 74 is fed through a switch element F3 (e.g., an FET) to lead 76 connected to the setting input 78 of the comparator flip-flop 80. Element F3 is normally non-conducting (as indicated at 82) but will be conducting whenever a signal (indicated at C) is supplied to its control input 84. The output 74 of the calibration comparator 70 will therefore "set" then comparator flip-flop 80 when the integrated value of the standard signal equals the voltage $V_R$ fed to the calibration comparator and a C signal (which will be present during the calibration mode of operation, as will be seen subsequently) is present on the control input 84 of switch element F3. Setting of comparator flip-flop 80 will cause the flip-flop to be in condition to supply a signal S as indicated at its lower output 88. Presence of this S signal will cause stopping of the integration by the first integrator 60 (by rendering switch element F2 non-conducting) as well as causing stopping of the second integrator yet to be described.

The signal output 50 is also connected by lead 90 to one side of a manually closable, normally open switch, schematically illustrated as a pushbutton 92, which is mechanically linked as indicated at 94 at similar manually closable switch 96. Pushing of ganged switch 92 will therefore connect the input signal at lead 90 to lead 98 to apply the signal to a first capacitor $C_1$. Besides being stored by this capacitor, the input signal will reach the input 100 of a buffering amplifier 102, the output at 104 of which is fed through a normally conducting switch element F4 to the input lead 106 of a second integrator 110. The output lead 112 of this integrator, carrying the integrated voltage $V_2$, will be fed directly through lead 114 to the lower input 116 of a second or measuring comparator 120. The same output is also connected by means of lead 122 to normally non-conducting switching element F5. When the device is in its calibration mode, the C (calibration mode) signal will be present on the control input 124 of element F5 so that the integrated voltage $V_2$ will be connected through this switch to lead 126. Integrated voltage $V_2$ on lead 126 will cause charging of the second capacitor $C_2$ to this integrated voltage value, the voltage on capacitor $C_2$ being fed through input lead 128 to a buffering amplifier 130, the output of which at 132 is connected to the upper input 134 of the second comparator 120. During the calibration mode (the output 136 of) the second comparator is not utilized since the normally non-conducting switch element F6 will not be receiving at its control input 138 the enabling signal M, which, as will be subsequently seen, is present only during the later measuring mode of operation.

The other switch element 96 of the ganged manual pushbutton will cause activation of the setting input 142 of the second or mode-selecting flip-flop 150, as by connecting a constant voltage source 144 to the input 142 by lead 146, switching element 96, and lead 148. Setting of mode-selecting flip-flop will cause it to be in such condition as to generate a C (calibration mode) signal, schematically represented as the upper output 152 of the flip-flop. Thus, manually closing of ganged switches 92, 96 will cause this calibration mode signal C to be continuously generated, so as to be present on the enabling inputs to each of switching elements F3 and F4 previously described. The mode-selecting flip-flop 150 will be reset by the "PRINT" signal applied to its resetting input 154, which signal may be repetitively generated (in the exemplary embodiment every one-half second or 500 milliseconds) as the output 156 of a "clock" 160. This resetting pulse will change the condition of flip-flop 150 so as to cause it to assume a condition of generating the M (measuring mode) signal, schematically illustrated as being its lower output 162. However, as long as the manual ganged switch 92, 96 is pressed, the mode-selecting flip-flop 150 will be immediately "set" again to its C (calibration mode) condition, so that the presence of a signal at its setting input 142 will effectively override the pulse supplied at its resetting input 154 as long as switch 96 is held conducting by the operator. The "PRINT" pulse at the output 156 of clock 160 will also be fed by lead 164 to input 166 of a one-shot pulse-stretching multivibrator 170. Such a circuit, as is well known, has a stable condition and an unstable one, and will be set to the unstable condition by the presence of a pulse on its input 166. After a moderately short period of time (e.g., 10 milliseconds in the exemplary embodiment) the multivibrator will return to its stable condition. Thus, after receiving a PRINT pulse at input 166, multi-vibrator 170 will be temporarily caused to assume its unstable condition to generate an R (reset) signal, schematically illustrated at its upper unstable output 172; after 10 milliseconds, multivibrator 170 will return to its stable condition, in which the R output will disappear.

The (10 millisecond long) reset signal R will be supplied to various elements of the device. This R signal will be supplied at the upper resetting input 174 of the comparator or integration-time determining flip-flop 80, to reset the flip-flop from its condition generating an S signal to its condition generating an I (integrating) signal as schematically illustrated at its upper output 176. Also, the reset signal R will be supplied to the control inputs 178, 180, respectively, of switching elements F7 and F8. These switching elements will therefore close a short circuit (through leads 182 and 184, and 186 and 188, respectively) between the input and output of integrators 60 and 110, respectively, to cause discharge of the feedback capacitor of these integrators so as to effectively reset or zero them. Switching elements F2 and F4 at the input to these integrators will be rendered non-conducting by the presence of the R signal, as well as an S signal.

OPERATION

Manual Set and Calibration Modes

As previously described, the pushbutton switch 20 is moved to its upper position, and the operator adjusts tap 10 until volt meter 42 has the desired "decimal relationship" to the known standard signal, $v_s$, to be applied to the signal input 50 during the immediately subsequent calibration mode. After allowing switch 20 to return to its lowermost ("CALIBRATE AND MEASURE") position, the operator manually moves and holds ganged switches 92, 96 in their downward (CALIBRATE) position, thereby causing mode-selecting flip-flop 150 to be set to its "calibrate mode" condition C, and input capacitor $C_1$ to store the standard signal, $v_s$, present at main input 50. The next occurring PRINT pulse from clock 160 will cause multi-vibrator 170 to generate a (say, 10 milliseconds long) reset signal R, which resets both integrators 60 and 110 and therefore (since F5 is conducting) the second integrator output capacitor $C_2$ to zero, as well as resetting flip-flop 80 to its I (integrate) condition. Integration actually starts, however, only when the end of the R signal allows input switching elements F2 and F4 to simultaneously close. The first integrator 60 receives the standard signal $v_s$ directly (via 50, 54, F2, 56 and 58), while the input 106 of the second integrator 110 receives the same $v_s$ signal (through lead 100, unit-gain buffering amplifier 102, lead 104 and element F4) both from the main input 50 (via 90, 92, 98) and from the capacitor $C_1$ which has been and remains charged to this same voltage, $v_s$. Both integrators therefore integrate the same signal ($v_s$) starting at the same time.

The output 74 of the first comparator 70 will be effectively connected to the setting input 78 of flip-flop 80, since the calibration mode signal C will be present on the enabling control input 84 of switching element F3. Thus, the first comparator 70 will stop integration of both integrators, by setting flip-flop 80 to S and thereby opening F2 and F4, when the integrated voltage $V_1$ (at 68) from the first integrator 60 equals the manually set reference voltage $V_R$. This determines the integration time ($t_i$) of both integrators. During this same integration time, the second integrator will integrate the same standard (i.e., known) input signal to cause charging of the second capacitor $C_2$ to the integrated output voltage $V_2$ thereof. Even if the manually operated ganged switch 92 is released during this integration time, the second integrator will continue, since the standard signal will be retained (in unintegrated form $v_s$) at its input by the first capacitor $C_1$, which is protected from gradual discharge by buffering amplifier 102. In general, the first capacitor $C_1$ will retain the standard signal ($v_s$) regardless of the later condition of the manual switches (92, 96) and electrically controlled switching elements (F4, F5, F8). The attained maximum integrated value at $V_2$ (after time $t_i$) is stored on capacitor $C_2$, and the second capacitor $C_2$ will be discharged by a subsequent R signal only if switching element F5 is conducting (i.e., C continues) when the R signal occurs. Since the mode-selecting flip-flop 150 will change from its calibration (C) to its measuring (M) condition the first time a PRINT pulse occurs after manual switch 96 has been released, switching element F5 will become non-conducting at the beginning of the next resetting signal R. Thus, the second capacitor $C_2$ will hold the (last) maximum value of the integrated voltage $V_2$ once the manual ganged calibration switch 92, 96 is released to its non-conducting position.

The time ($t_i$) required for the standard input voltage ($v_s$) to be integrated by the first integrator to reach the manually set reference voltage $V_R$ is therefore the desired gain factor. The second integrator will therefore be stopped with a value on its second capacitor $C_2$ equal to the integrated voltage $V_2$ reached during this same integration-time ($t_i$) period. Therefore, the time required for the standard input voltage ($v_s$) still on the first capacitor $C_1$ to be again integrated by the second integrator to the integrated voltage value now stored on the second capacitor $C_2$ will be the same as the integration time ($t_i$) just completed by both integrators. Thus, the second integrator may be now utilized in a manner of a clock to regenerate this time interval (which is the effective gain factor) during subsequent measurement of unknown samples, hereinafter referred to as the "-measuring mode".

Since an integration period (I) always follows the reset (R) signal (because flip-flop 80 is reset to I thereby), the meter-switching element F1 becomes conducting as the I signal is changed to S by operation of the first comparator 70 just described. Therefore the meter 42 and holding capacitor $C_H$ receive the integrator output voltage $V_1$ only when it has reached its maximum value (which should be equal to $V_R$) at the end of the integration time ($t_i$). This provides a visual check that the device has actually integrated the standard signal ($v_s$) to a value equal to $V_R$.

Of course, the (invariable) integration rate of the first integrator will determine whether a particular standard (absorbance) signal $v_s$ can be integrated to reach the operator-chosen $V_R$ voltage within the maximum available integration time per cycle. To insure that the operator has not chosen too high a value of $V_R$ for the particular standard input signal, a warning device 200 is preferably provided. This device may consist of a resettable ramp generator 210 which starts to generate a voltage upon being fed an I signal at one input 212 and resets to zero voltage when an S signal is fed to its other input 214. Thus, in normal operation the ramp generator would be reset to zero repetitively (e.g., in less than one-half a second) so as to generate a saw-tooth voltage as at 220. However, if the standard signal cannot be integrated within the maximum integration time (say, 490 milliseconds) to reach the voltage level $V_R$ in a single cycle of operation (and since it is reset after each cycle, it would therefore never reach the voltage level $V_R$), the ramp generator 210 would not be reset by any S signal (at 214) during each (and therefore any) cycle. Under such conditions, the ramp generator output would continue to increase as indicated by dotted line 222 and an "over-range" indicator 230 (e.g., a light) connected to the ramp generator output would give a warning signal when fed a voltage above a certain level at 232 (e.g., that reached by the ramp generator after one full second of uninterrupted operation). In this manner, the highest usable $V_R$ can be chosen by the operator by his merely readjusting the manually set voltage $V_R$ downwardly by factors of 10 until the over-range indicator 230 is not initiated, thereby obtaining the greatest attainable gain (and lowest percentage systematic error).

Measuring Mode

Once the mode-selecting flip-flop 150 has been reset to its M condition by the first PRINT pulse following release of the manual calibrate switch 96 described above, the device is prepared for performing a measurement according to the scale determined by the gain factor (integration time $t_i$) obtained during the calibration mode. An unknown signal $v_m$ is now present at input 50, and the device will "multiply" this by the calibrated gain factor and ultimately supply this "-scaled" signal to the meter 42. This measuring mode operation is accomplished as follows.

The I (integrate) signal will occur repetitively during both modes of operation because of the repetitive nature of the PRINT signal from clock 160 and therefore the resetting signal R from multi-vibrator 170, so that flip-flop 80 is always reset to its I condition (e.g., every 500 milliseconds). Therefore, the two integrators will simultaneously start integrating as soon as their input switching elements F2 and F4 are rendered conducting by the end of an R pulse.

The second integrator 110 integrates the voltage $v_s$ stored on capacitor $C_1$ and supplies the integrated voltage $V_2$ to the lower input 116 of the second or measuring comparator 120. The upper (134) input to the measuring comparator 120 will receive the voltage previously stored on now isolated capacitor $C_2$; this capacitor retains the maximum reached integrated voltage $V_2$ of the previously calibrated operation, since F5 became non-conducting at the end of the last cycle of calibration mode (when the C signal disappeared). The integrated voltage $V_2$ of the voltage ($v_s$) on capacitor $C_1$ will become equal to the stored voltage on capacitor $C_2$ in exactly the same time interval ($t_i$) as was required to charge capacitor $C_2$ to this value. Therefore, the output 136 of the second or measuring comparator will occur at a time after initiation of integration exactly equal to that of the integration time during the calibration mode, thereby acting as a clock for regenerating this time interval ($t_i$). Since during the measuring mode the mode-selecting flip-flop 150 will remain in its "reset" state to generate the measuring mode signal M, switching element F6 will be conducting and the second or measuring comparator output 136 will therefore control, by lead 191 and junction 192, the setting of the comparator or integration-time determining flip-flop 80 to its stop-integration (S) condition.

During the integration period the first integrator 60 has been integrating the signal ($v_m$) from input 50 (proportional to the absorbance of the unknown sample), so that the output voltage $V_1$ will be the integral of this unknown voltage. When the second integrator 110 and comparator 120 cause setting of the flip-flop 80 to the stop integration condition (S) after the "stored" time interval ($t_i$), thereby stopping both integrators, the integrated voltage $V_1$ of the first integrator 60 will be at this time the unknown input voltage effectively multiplied by the same gain factor (i.e., the same time interval $t_i$) as found in the calibration mode. During this measuring mode, the integrated voltage $V_1$ of the actual sample signal will be supplied to terminal 52 of the closed switch 20 so as to be present on lead 28. Switching element F1 will allow this signal to reach the meter 42 and the holding capacitor $C_H$ whenever neither a reset (R) nor an integrate (I) signal is present at contact 38 and therefore the control input 34 of element F1. Therefore, whenever the integration-time determining flip-flop 80 is caused to change from its I to its S state by the output of the second comparator 120, the fully integrated unknown voltage $V_1$ will be transferred to the holding capacitor $C_H$ as well as displayed on the meter 42 (and subsequently recorded by the optional recording readout 46 on the next occurring PRINT signal supplied at enabling input 190). This, the original unknown signal $v_m$ will be effectively multiplied by the same gain factor, by being integrated for the same period of time, as was the standard signal $v_s$ during the calibration mode. Therefore, the integrated unknown voltage $V_1$ will have been effectively multiplied by this desired gain factor, when it is displayed on meter 42.

This insure that the input 100 receives the standard input signal $v_s$ for at least one complete cycle during the calibration, it is only necessary to hold the manual calibratioN switch 92, 96 for just more than one such cycle (e.g., just over one-half second). This insures that at least two cycles occur (because of the previously explained operation of the mode-selecting flip-flop 150), during at least the second cycle of which the standard input signal $v_s$ will be present at all times on input 100 and the first holding capacitor $C_1$.

Any systematic error caused by the comparators 70 and 120 not changing their output as their two inputs "-cross" in value will remain very small in the exemplary embodiment. Thus a few millivolts of uncertainty in the comparators will cause only a few tenths of 1 percent error if the input levels (e.g., $V_R$, etc.) are a few volts. Since in practice the operator chooses the $V_R$ value as high as is reasonable, such uncertainty remains quite small in practice. By utilizing substantially the same signal magnitudes in both integrators, such uncertainty of both of the comparators (during the calibration and measuring modes respectively) only contributes this small uncertainty (i.e., substantially less than one percent) in the final integrated voltage $V_1$. The use of as large a gain factor (i.e., integration time $t_i$) as is obtainable also provides the greatest amount of noise averaging during the actual measurement.

More importantly the fact that the same integrator (60) is used to determine the later apply the integration time gain factor completely compensates for any systematic error in this integrator. Similarly, the use of the second integrator (110) for both storing and regenerating this gain factor compensates any systematic error of this integrator. It may be noted in passing that a single comparator with input switching may be utilized in place of the two comparators 70, 120 (with output switching), but compensation of systematic error but require that the inputs to such a single comparator be relatively reversed during the calibration and measuring modes. Therefore not only would more switching elements be required but additional inverters which might add their own systematic errors. Because of the relatively low price of reasonably precise solid state comparators, two comparators were used in the successful prototype device conforming substantially to that shown and described, which exhibited a high precision, that is, having substantially less than one percent uncertainty in the final measured voltage $V_1$.

I claim:

1. Apparatus for causing an unknown signal to be presented according to a predetermined desired scale, comprising:

means for determining the effective gain factor necessary to make a standard known input signal reach a particular set voltage level;

means for storing this gain factor;

means for regenerating said stored gain factor;

and means, operatively controlled by said regenerating means, for applying this regenerated gain factor to an unknown input signal, said determining means and said applying means comprising substantially the same structure, used in substantially the same manner but at different times, whereby the unknown signal is presented as a final signal according to a scale determined by the proportionality constant between the standard known input signal and the set voltage level, and systematic error in determining the effective gain factor tends to be cancelled by similar compensating error in the application of this effective gain factor.

2. Apparatus according to claim 1, in which:

said storing means and said regenerating means comprise substantially the same structure, utilized in substantially the same manner, whereby systematic error in the gain factor caused by the storing tends to be cancelled by similar compensating error in the regenerating of the gain factor.

3. Apparatus according to claim 1, in which:

said set voltage level is produced by a manually adjustable voltage source, variable over substantially more than one decade of voltage values, whereby said proportionality constant may be chosen by the operator from at least two different values differing by a factor of ten, so that the final signal is presented according to a particular chosen scale.

4. Apparatus according to claim 3, in which:

an over-range warning device is additionally provided for indicating that the proportionality constant between the standard signal and the voltage level chosen by the manually adjustable voltage source is no greater than the largest gain factor available from the other elements of the apparatus.

5. Apparatus according to claim 1, in which:

said storing means and said regenerating means receive a constant input signal substantially equal to said standard signal;

said storing means and said regenerating means, respectively, operate according to the same mathematical function of said constant input signal, and said determining means and said applying means operate according to the same mathematical function of said standard input signal and said unknown input signal, respectively;

whereby any noncompensating systematic errors of said determining means, said storing means, said regenerating means, and said applying means tend to be at least of the same order of magnitude, so as to tend to produce minimum absolute and percentage error in the final signal.

6. Apparatus according to claim 1, in which:

said determining means comprises a first integrator for integrating said standard signal for such time until the integrated value thereof is equal to said predetermined set voltage level, said integration time thereby being the effective gain factor;

said storing means effectively stores said integration time;

said regenerating means effectively repetitively supplies said integration time;

and said applying means comprises said first integrator, which integrates said unknown signal for the same said integration time as supplied by said regenerating means, whereby systematic error in said first integrator causes compensating error in both the integration time determined from the standard signal and the integrated value of the unknown signal forming the final signal.

7. Apparatus according to claim 6, in which:

said storing means comprises a second integrator integrating a constant input signal for the same integration time as said first integrator, and holding means for storing this time integral of said constant input signal at the end of said integration time;

said regenerating means comprises the same second integrator receiving the same constant input signal, and means for generating an integration complete signal when the output of said second integrator equals said time integral of said constant input signal stored by said holding means;

and said first integrator comprising said applying means is controlled by said integration complete signal generated by said regenerating means;

whereby systematic error in said second integrator during said storing operation tends to be compensated by similar systematic error in its regeneration operation.

8. Apparatus according to claim 7, in which:

said constant input signal supplied to said second integrator is substantially identical to said standard input signal, whereby any noncompensating systematic errors in said first integrator and associated elements and in said second integrator and its associated elements will tend to be at least the same order of magnitude, so that the additive effect of such errors in the final signal tends to be minimized.

* * * * *